United States Patent

Wu

[11] Patent Number: 5,877,056
[45] Date of Patent: Mar. 2, 1999

[54] ULTRA-SHORT CHANNEL RECESSED GATE MOSFET WITH A BURIED CONTACT

[75] Inventor: Shye-Lin Wu, Hsinchu, Taiwan

[73] Assignee: Texas Instruments-Acer Incorporated, Hsinchu, Taiwan

[21] Appl. No.: 4,448

[22] Filed: Jan. 8, 1998

[51] Int. Cl.⁶ .................................................. H01L 21/336
[52] U.S. Cl. .................... 438/291; 438/297; 438/299; 438/585
[58] Field of Search .................................... 438/291, 297, 438/299, 585, 589, 591, 595, 300

[56] References Cited

U.S. PATENT DOCUMENTS

| | | | |
|---|---|---|---|
| 5,290,716 | 3/1994 | Nakamura | 438/481 |
| 5,523,258 | 6/1996 | Petti et al. | 438/585 |
| 5,545,579 | 8/1996 | Liang et al. | 438/291 |
| 5,552,329 | 9/1996 | Kim et al. | 438/291 |
| 5,571,738 | 11/1996 | Krivokapic | 438/291 |
| 5,583,064 | 12/1996 | Lee et al. | 438/300 |
| 5,605,855 | 2/1997 | Chang et al. | 438/291 |
| 5,766,998 | 6/1998 | Tseng | 438/291 |

*Primary Examiner*—John Niebling
*Assistant Examiner*—Lynne A. Gurley
*Attorney, Agent, or Firm*—Harness, Dickey & Pierce, P.L.C.

[57] ABSTRACT

Following with the formation of pad insulator layer and a stacked layer stacked, a gate insulator is formed within the defined gate insulator space. A lightly doped region is doped and the stacked layer and the pad insulator layer is removed. A semiconductor layer is formed and a gate space is defined over the gate insulator through a spacer structure. An anti punchthrough region is formed followed by the formation of a first insulator layer. A gate filling is then formed to fill within the gate space. A portion of the first insulator layer is then removed. A step of doping a plurality of junction ions is applied. A second insulator layer is formed and a thermal process is then proceeded. Finally a metalization process is employed on the semiconductor substrate.

36 Claims, 5 Drawing Sheets

ULTRA-SHORT CHANNEL RECESSED GATE MOSFET WITH A BURIED CONTACT

FIELD OF THE INVENTION

The present invention relates to the transistors in semiconductor manufacturing, and more specifically, to a method of forming an ultra-short channel gate recessed MOSFET (metal oxide semiconductor field effect transistor) with a buried contact.

BACKGROUND OF THE INVENTION

From the birth of the first integrated circuits at 1960, the number of devices on a chip has grown in an explosive increasing rate. The progress of the semiconductor integrated circuits has step into ULSI (ultra large scale integration) level or even higher level after almost four decades of developments. The capacity of a single semiconductor chip increases from several thousand devices to hundreds of million devices, or even billions of devices. Integrated circuits devices like transistors, capacitors, and connections must be greatly narrowed accompanying with the advancement. The increasing packing density of integrated circuits generates numerous challenges to the semiconductor manufacturing process. Every element or device needs to be formed within smaller area without influencing the characteristics and the operations of the integrated circuits. The demands on high packing density, low heat generation, and low power consumption devices with good reliability and long operation life must be maintained without any degradation in their functions. These achievements are expected to be reached with the simultaneous developments and advancements in the photography, the etching, the deposition, the ion implantation, and the thermal processing technologies, namely the big five key aspects of semiconductor manufacturing. The continuous increase in the packing density of the integration circuits must be accompanied with a shrinking minimum feature size. With present semiconductor manufacturing technology, the processes with a generally one-third micrometer in size is widely utilized. For making the next generation devices, the technologies focusing mainly on one-tenth micrometer or even narrower feature sizes are highly demanded.

Transistors, or more particularly the metal oxide semiconductor field effect transistors (MOSFET), are the most important and frequently employed devices in the integrated circuits with high performance. However with the continuous narrowing of device size, the sub-micron scale MOS transistors have to face so many risky challenges. As the MOS transistors become narrower and thinner accompanying with shorter channels, problems like the junction punchthrough, the leakage, and the contact resistance, cause the reduction in the yield and reliability of the semiconductor manufacturing processes.

For developing future MOS devices with a sub-micrometer or even smaller feature size, the ultra shallow junctions are required to suppress the short channel effects encountered with the down scaling sizes. In the work of Y. Nakahara et al. ("Ultra-shallow in-situ-doped raised source/drain structure for sub-tenth micron CMOS", Symposium on VLSI Technology Digest of Technical Papers, 1996 IEEE), the challenge in forming one-tenth micrometer MOSFET is disclosed. The requirement on ultra shallow junctions is proposed for suppress short channel effects while keeping parasitic resistance low to obtain high current derivability. However, it is difficult to make the ultra shallow junction and form metal contact without degrading the device performance. In the article "0.15 $\mu$m Delta-doped CMOS with On-field Source/Drain Contacts" proposed by K. Imai et al. in Symposium on VLSI Technology Digest of Technical Papers, 1996 IEEE, the problem is also addressed. The importance of the reduction in parasitic source/drain junction capacitance from the contacts is also emphasized especially for sub-micron CMOS (complementary metal oxide semiconductor) devices.

SUMMARY OF THE INVENTION

A method combating the limitation of the feature size at the present stage is provided with the accompanying solution to the aforementioned drawbacks of the present stage semiconductor technology. The present invention provide a method to form an ultra shallow junction in a transistor for the next generation, small feature size devices. An accompanying buried contact without degrading the performance of the devices is also formed. The method is proposed to solve the short channel problem. The short channel immunity is significantly improved by using the recessed gate structure and the ultra shallow junction. The packing density is greatly increased by using the buried contact technology for providing smaller size and lower resistance and capacitance connections.

The method of the present invention in forming a transistor, more specifically a MOSFET, on a semiconductor substrate includes the following steps. A pad insulator layer is formed over the semiconductor substrate and a stacked layer stacked over the pad insulator layer is formed. A step of removing a portion of the stacked layer for having an gate insulator space in the stacked layer to the pad insulator layer. A gate insulator is formed within the gate insulator space over the semiconductor substrate. A step of doping a lightly doped region is applied with a first concentration of a first dopant type within the semiconductor substrate uncovered by the gate insulator and the isolation region. Following with the removing of the stacked layer and the pad insulator layer, a semiconductor layer is formed over the semiconductor substrate. A portion of the semiconductor layer over the gate insulator is then removed to define a space over the gate insulator.

A spacer structure is formed in the space on a side wall portion of the semiconductor layer. A step of removing a portion of the gate insulator is employed for having a gate space over the semiconductor substrate. A step of doping is applied for forming an anti punchthrough region in the semiconductor substrate under the gate space with a second concentration of a second dopant type. A first insulator layer is formed on the semiconductor substrate under the gate space and on the semiconductor layer. Following with the forming of a gate filling to fill within the gate space, a portion of the first insulator layer which is uncovered by the gate filling is then removed. A step of doping a plurality of junction ions is applied with a third concentration of a third dopant type into the semiconductor layer. A second insulator layer is formed over the semiconductor substrate. A thermal process is then proceeded to the semiconductor substrate. Finally, a metalization process is employed on the semiconductor substrate for forming a set of connections to the semiconductor layer.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of forming an ultra-short channel MOSFET with a buried contact is provided in the present invention. A recessed gate structure can be formed through the formation of a gate insulator on the semiconductor substrate. An extremely short gate region can be defined through the formation of a spacer structure. A high quality gate insulator layer can be formed by the regrowth of an oxynitride film being grown from the semiconductor substrate. The buried contacts to the active regions can be formed through the formation of a semiconductor or silicon layer over the semiconductor substrate. An ultra shallow junction region can be formed by employing a silicon layer as a diffusion source. An ultra-shallow source/drain junction with an extended lightly doped drain structure solving the short channel effect can be achieved. The buried contacts in the present invention for forming the connections with a low RC delay provides a high operation speed with a low heat generation and a low power consumption. The method of forming an ultra-short channel MOSFET with an ultra short channel and the buried contacts is described as following.

Figure 1:
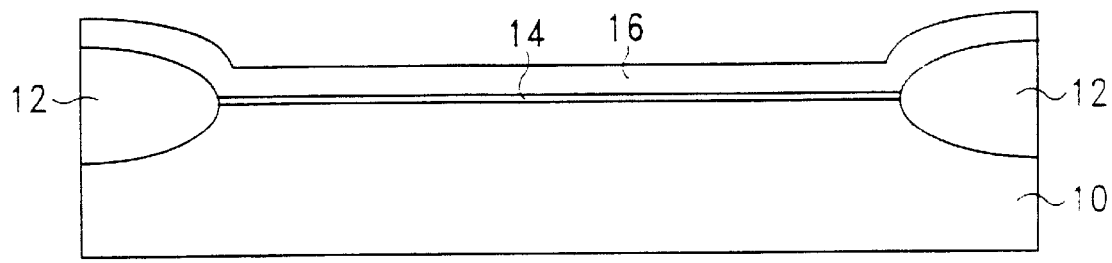
FIG. 1 illustrates a cross sectional view of the formation of a pad insulator layer and a stacked layer on the semiconductor substrate in the present invention.

The method and the steps in the present invention applied on a semiconductor wafer can create different types of transistors like the NMOS and the PMOS transistors with a greater number of devices at a time. For a clear illustration, the steps for forming a single NMOS transistors are illustrated. The PMOS transistors can also be build applying the similar method. Since the variations in the processes for incorporating the formation of the PMOS transistors are well known in the art, the details are not described. Referring to FIG. 1, a semiconductor substrate 10 with a preferable single crystalline silicon in a <100> direction is provided. An isolation region using field oxide isolation 12 or other isolation technology like trench isolation (not shown) is formed on the semiconductor substrate 10. A pad insulator layer 14, like a thin oxide layer is formed. The thin oxide layer 14 can be thermally grown on the semiconductor substrate 10 with a thickness ranging from about 50 angstroms to 400 angstroms. A stacked layer 16 stacked over the thin silicon oxide layer 14 is then formed. The stacked layer 16 like a silicon nitride layer 16 deposited with a thickness of about 300 angstroms to 2000 angstroms can be employed.

Figure 2:
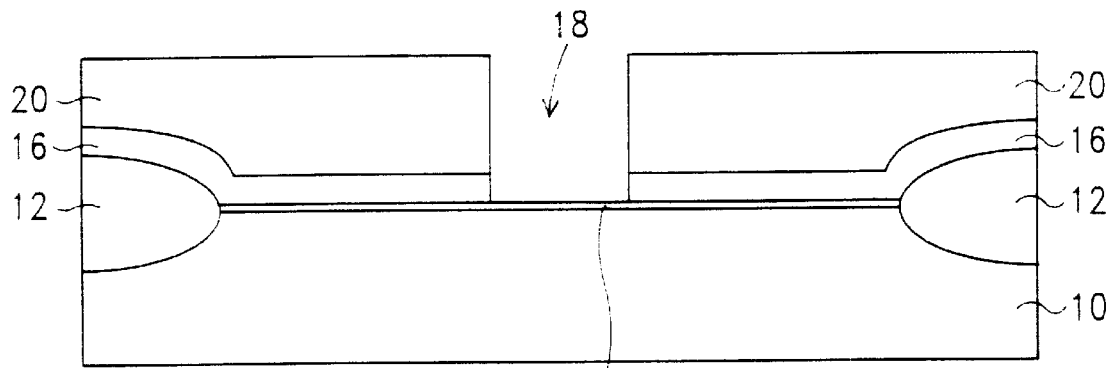
FIG. 2 illustrates a cross sectional view of removing a portion of the stacked layer for having an gate insulator space in the stacked layer to the pad insulator layer in the present invention.

A portion of the nitride layer 16 is the removed for having a gate insulator space 18 in the nitride layer 16 substantially above the silicon oxide layer 14, as shown in FIG. 2. A lithography and an etching process can be applied in doing the work. A photoresist layer 20 is formed and patterned for defining a gate region. The silicon nitride layer 16 is then etched to have gate insulator space 18 subsequently above the thin silicon oxide layer 14. The etchants like $CCl_2F_2$, $CHF_3$, $CF_4/O_2$, $CF_4/H_2$, $CHF_3$ and $CH_3CHF_2$ can be applied in etching the defined gate region in the silicon nitride layer 16, with a process like a reactive ion etching (RIE) employing plasma generation. The photoresist layer 20 is removed after the gate insulator space 18 is etched off.

Figure 3:
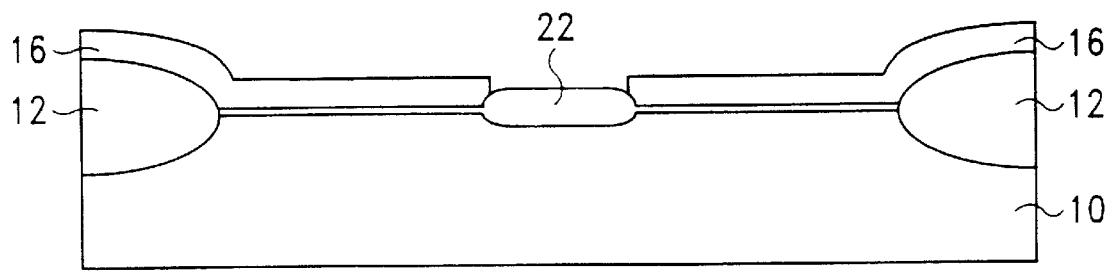
FIG. 3 illustrates a cross sectional view of the formation of a gate insulator within the gate insulator space over the semiconductor substrate in the present invention.
Figure 4:
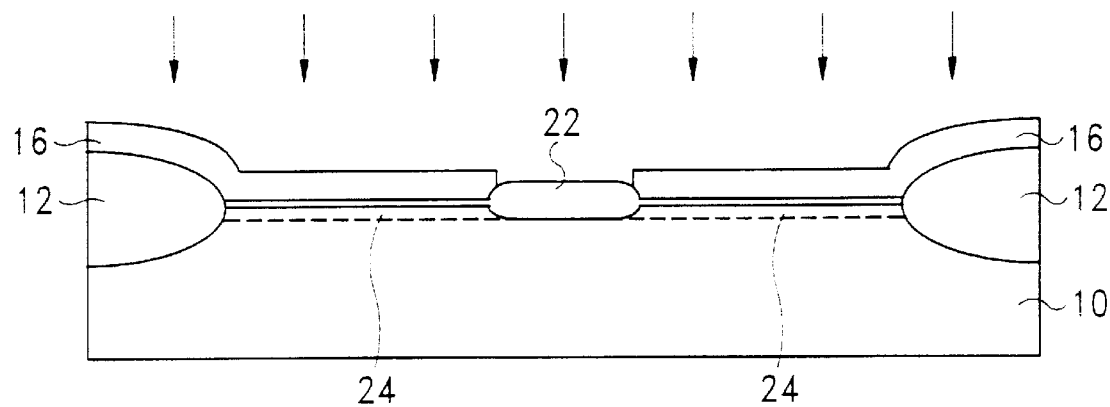
FIG. 4 illustrates a cross sectional view of the doping of a lightly doped region within the semiconductor substrate uncovered by the gate insulator and the isolation region in the present invention.

Referring to FIG. 3, a gate insulator 22 is then formed within the gate insulator space 18 over the semiconductor substrate. In the case, the gate insulator 22 is formed from the growing of an oxide insulator from the semiconductor substrate 10 with the expansion of the thin oxide layer 14. The growing of the oxide insulator 22 can be performed with thermal process to the semiconductor substrate 10 in a oxygen and steam containing ambient. A lightly doped region 24 can be formed in the semiconductor substrate under the region uncovered by the oxide insulator 22 and the isolation region 12, as shown in FIG. 4. Using the oxide insulator 22 and the isolation region 12 as a mask, a process like an ion implantation of arsenic or phosphorous containing ions at an energy between about 40 KeV to 300 KeV, to have a dose between about 5E12 to 5E14 atoms/cm$^2$ is employed. The implantation ions penetrate through the silicon nitride layer 16 and the thin oxide layer 14 and form the lightly doped region 24. For forming a PMOS transistor, the ion implantation with arsenic or phosphorous containing ions can be substituted with a boron containing ions.

Figure 5:
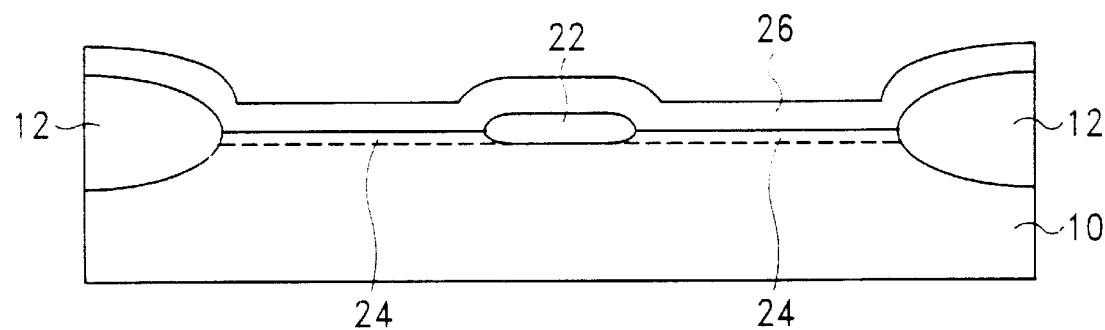
FIG. 5 illustrates a cross sectional view of the removing of the stacked layer and the pad insulator layer, and the formation of a semiconductor layer over the semiconductor substrate in the present invention.
Figure 6:
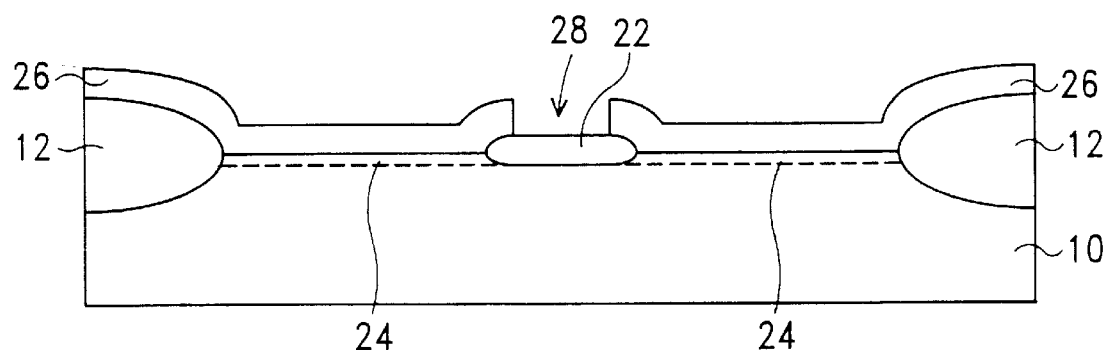
FIG. 6 illustrates a cross sectional view of removing a portion of the semiconductor layer over the gate insulator to define a space over the gate insulator in the present invention.

The silicon nitride layer 16 and the thin oxide layer 14 are then removed through one or more etching processes. A semiconductor layer 26 is formed over the semiconductor substrate 10, as shown in FIG. 5. In the present semiconductor processes, a most frequently used semiconductor material is silicon. An undoped polysilicon or amorphous silicon layer formed by a chemical vapor deposition process can be utilized as the semiconductor layer 26, with a thickness of about 300 angstroms to 3000 angstroms. A portion of the silicon layer 26 over the oxide insulator 22 is removed to define a space 28 for a gate structure over the oxide insulator 22, as shown in FIG. 6. A lithography process and a plasma etching process can be employed in defining the space 28, as an example.

Figure 7:
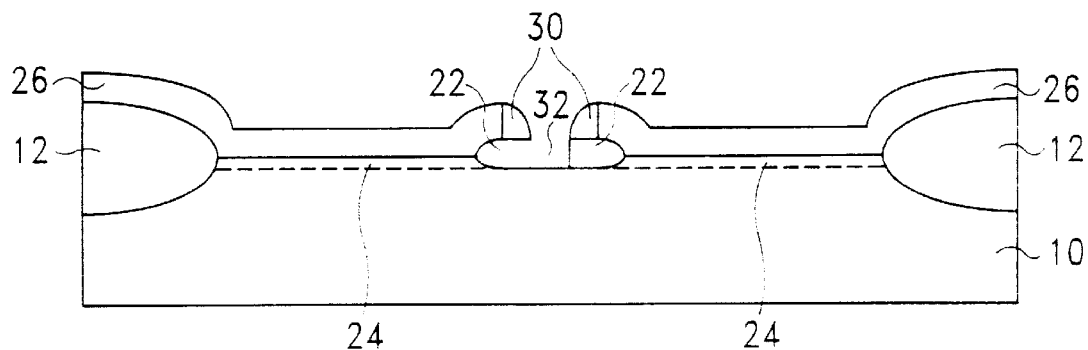
FIG. 7 illustrates a cross sectional view of the formation of a spacer structure in the space on a side wall portion of the semiconductor layer in the present invention.

A spacer structure 30 is then formed on the side wall of the space 28 and above the oxide insulator 22, as illustrated in FIG. 7. In the case, the spacer structure 30 is formed by sequentially depositing and etching back process a silicon nitride layer, through a self-aligned process without utilizing a lithography process. The portion of the gate insulator 22 under the defined space within the spacer 30 is removed for having a gate space 32 over the semiconductor substrate 10. In general, the removing of the gate insulator 22 is performed with an anisotropic etching process, like reactive ion etching (RIE), with the etchants like $CF_4$, $CCl_2F_2$, $CHF_3/CF_4$, $CHF_3/O_2$, and $CH_3CHF_2$. A gate space 32 with extremely narrow width or size is formed. With the above process, a definition of the gate width narrower than the limitation of the present lithography process is achieved. For example, if the minimum gate width defined by the lithography process is 0.1 micrometer, the size or width of the narrowed hollow space can be much narrower, and can be controlled accurately by adjusting the thickness of the spacer structure 30.

Figure 8:
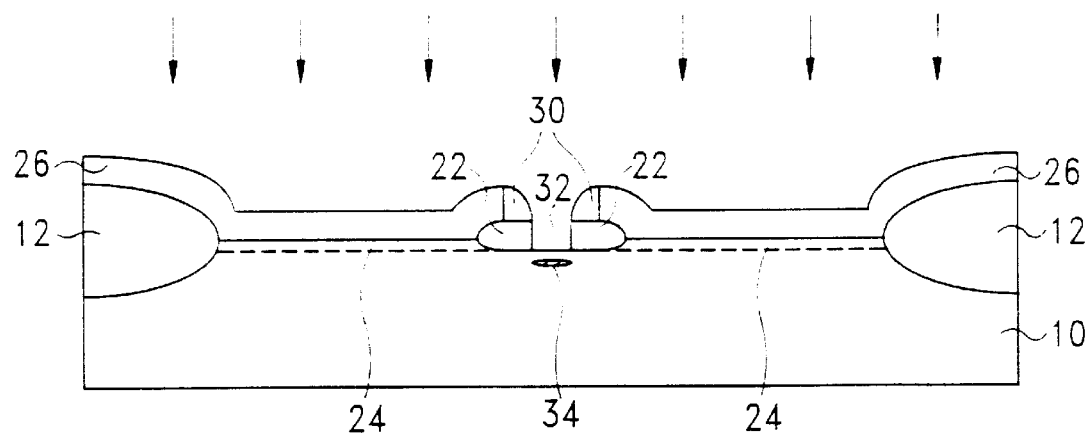
FIG. 8 illustrates a cross sectional view of the doping for forming an anti punchthrough region in the semiconductor substrate under the gate space in the present invention.

Referring to FIG. 8, a punchthrough stopping or anti punchthrough region 34 is formed by a doping, or more specifically an ion implantation process. For forming a NMOS transistor, a boron containing dopant implantation with an energy between about 0.5 KeV to 30 KeV to have a dose between about 5E11 to 5E13 atoms/$cm^2$ is employed to prevent the punchthrough effect in the channel under the gate space 32. For forming a PMOS transistor, the ion implantation with boron containing ions can be substituted with a arsenic or phosphorous containing ions.

Figure 9:
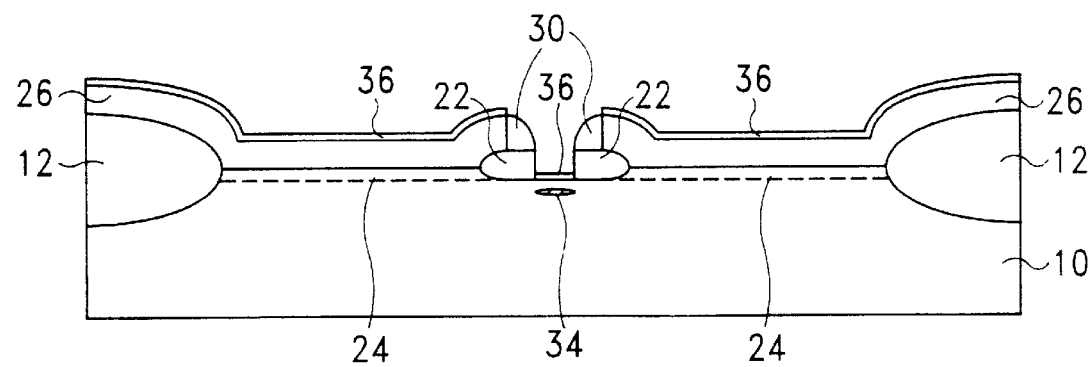
FIG. 9 illustrates a cross sectional view of the formation of a first insulator layer on the semiconductor substrate under the gate space and on the semiconductor layer in the present invention.

A first insulator layer 36 is formed on the semiconductor substrate 10 under the gate space 32 and on the silicon layer 26, as shown in FIG. 9. For a better quality of the first insulator layer 36 as a gate insulator layer, a thin oxynitride film thermally grown from the semiconductor substrate 10 and the silicon layer 26 in a nitrogen and oxygen containing gas ambient, like a $N_2O$ or NO ambient, is used. The thin oxynitride film can be grown with a thickness between about 20 angstroms to 250 angstroms. The superior quality and effect of the thin oxynitride film 36 as a gate insulator layer have been investigated in details in the publications and is known to persons skilled in the art. An investigation of "Superior Damage-Immunity of Thin Oxides Thermally Grown on Reactive-Ion-Etched Silicon Surfaces in $N_2O$ Ambient" made by S. Y. Ueng et al. (in IEEE Trans. Electron Devices, vol. ED-41 No.5, 1994) is an example. The thin oxides thermally grown on reactive-ion-etched (RIE) silicon surfaces in $N_2O$ ambient have been studied. A great improvement in both the time-zero-dielectric-breakdown (TZDB) and the time-zero-dependent-breakdown (TDDB) characteristics is observed for the $N_2O$ grown oxides on (RIE)-treated silicon surfaces. A longer life time under accelerated tests is also found.

Figure 10:
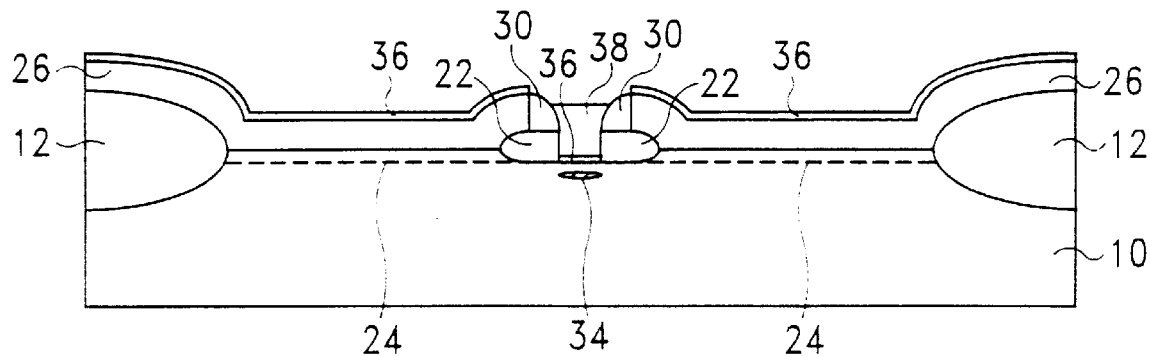
FIG. 10 illustrates a cross sectional view of the formation of a gate filling to fill within the gate space in the present invention.

Referring to FIG. 10, a gate filling 38 is formed to fill within the gate space 32 with a general material like polysilicon. The formation of the polysilicon gate filling 38 can be achieved by depositing an undoped polysilicon layer over the semiconductor 10 and then by etching to remove the portion not within the gate space 32. As an example, the process like a low pressure chemical deposition (LPCVD) process can be used in forming the undoped polysilicon layer. The etching process for forming the polysilicon gate filling 38 can be done by the method like an anisotropic etching using an etchant with a great variety of choices like $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$. The width of the silicon gate filling 38, which is determined by the thickness of the spacer structure 30, can be formed with about 0.3 micrometer to as narrow as about 0.01 micrometer or even smaller if it is needed.

Figure 11:
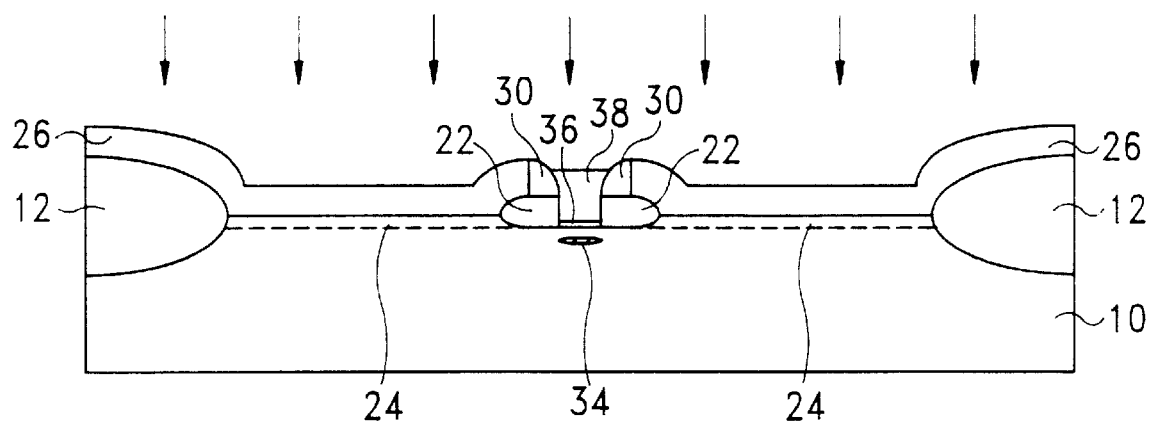
FIG. 11 illustrates a cross sectional view of the removing of a portion of the first insulator layer which is uncovered by the gate filling in the present invention.
Figure 12:
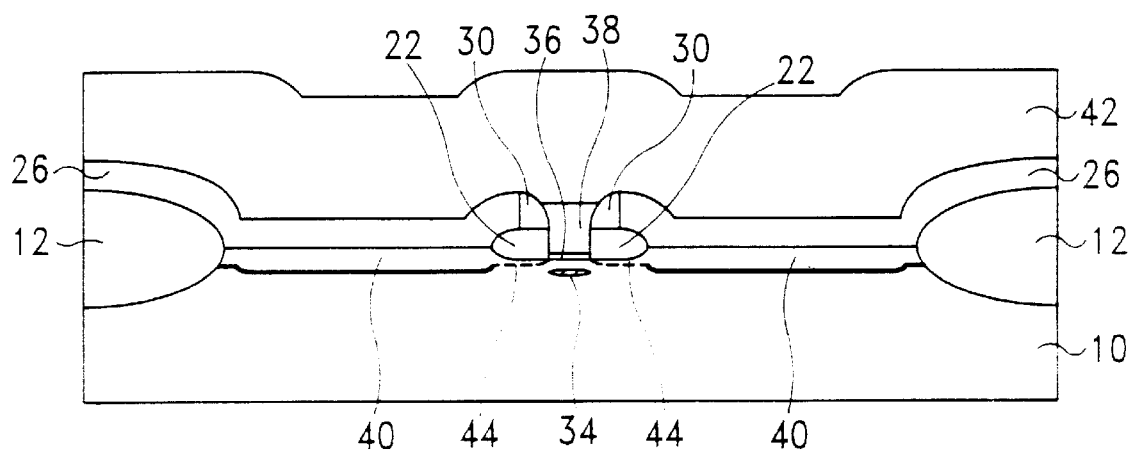
FIG. 12 illustrates a cross sectional view of the doping of a plurality of junction ions into the semiconductor layer and the formation of a second insulator layer over the semiconductor substrate in the present invention.
Figure 13:
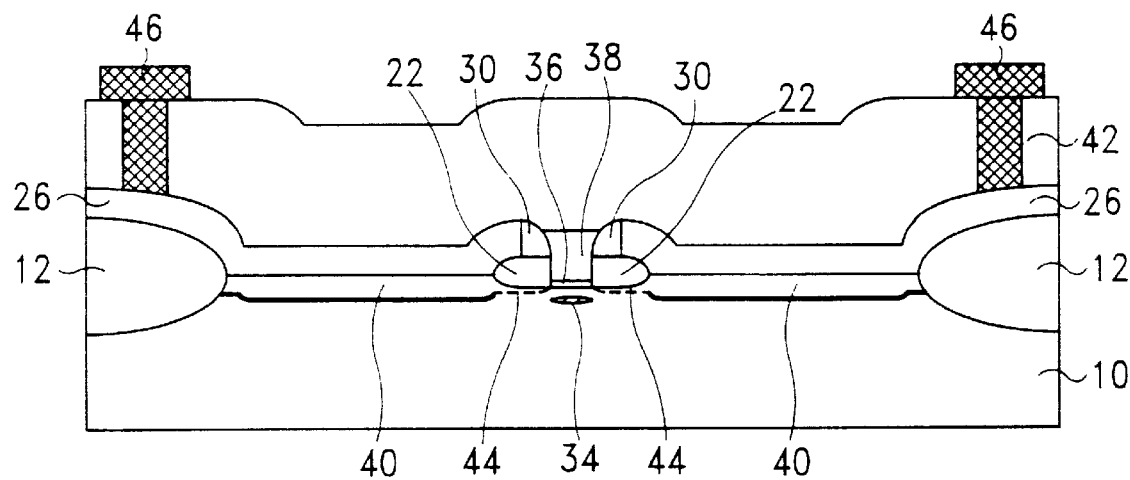
FIG. 13 illustrates a cross sectional view of after the performing of the metalization processes on the semiconductor substrate in the present invention.

A portion of the first insulator layer located over the silicon layer 26 is removed, as shown in FIG. 11. An wet etching process using etchants like the hydrofluoric acid with a buffer agent of ammonium fluoride can be applied. A junction region is then formed in the semiconductor by the diffusion of dopant ions, in the region uncovered by the isolation region, the gate insulator, and the gate filling. As an example, an ion implantation of arsenic or phosphorous containing ions at an energy between about 5 KeV to 100 KeV is employed to place most of the ions into the silicon layer 26. The silicon layer 26 after the implantation is doped as a diffusion source of the ions. Referring to FIG. 12, the junction region 40 can be formed with a following thermal process, which will be described in detail later. For forming a PMOS transistor, the ion implantation with arsenic or phosphorous containing ions can be substituted with a boron containing ions.

Still referring to FIG. 12, a second insulator layer 42 is formed over the semiconductor substrate 10 as an insulator layer for making connections in later processes. An example of the second insulator layer 42 can be a chemically vapor deposited (CVD) silicon oxide layer with a thickness between about 1000 angstroms to 10000 angstroms. A thermal process is then applied on the semiconductor substrate. The ions in the silicon layer 26 are driven into the semiconductor substrate 10 for forming the junction region 40 having a dose between about 5E14 to 5E16 atoms/$cm^2$. In the case, an rapid thermal process (RTP) with a temperature of about 700° C. to 1100° C. is used. The benefits of using the silicon layer as a diffusion source for forming the junction region can be acquired by referencing the investigation of S. L. Wu (the inventor of the present invention) et al. ("Characteristics of Polysilicon Contacted Shallow Junction Diode Formed with a Stacked-Amorphous-Silicon Film", IEEE Transactions on electron devices, Vol. 40, No 10, 1993) Many advantages are addressed in using the doped silicon film as the diffusion source to form a shallow junction. The method can avoid the metal spiking through the shallow p-n junction. The method also significantly increases the switching speed and the packing density resulting from the self-aligned structure. The third advantage mentioned in their work is that the polysilicon emitter transistor exhibits a higher dc current gain than conventional transistors.

The second insulator layer 42 of CVD oxide is condensed for a better quality and uniformity also during the thermal process. The ions in the lightly doped region 44 are also activated and redistributed to form an extended lightly doped source/drain region 44. A metalization process including a series of steps which are well known in the art, is performed finally on the semiconductor substrate 10 for forming the connections and plugs 46 to the silicon layer 26 above the junction 40. The formation of an NMOS transistor is finished.

An ultra-short channel MOSFET with the buried contact is formed by the method provided in the present invention. Through the spacer structure 30, an extremely short gate region can be defined without of the limitation of the present lithography technology. The operation performance of the MOSFET is raised by a high quality gate insulator layer formed by the regrowth of an oxynitride film. An accompanying buried contact without degrading the performance of the devices is also formed. The method is proposed to solve the short channel problem. The short channel immunity is significantly improved by using the recessed gate structure and the ultra shallow junction. The packing density is greatly increased by using the buried contact technology with the smaller size and lower resistance and capacitance connections.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a transistor in a semiconductor substrate, said semiconductor substrate having an isolation region, said method comprising the steps of:

forming a pad insulator layer over said semiconductor substrate;

forming a stacked layer stacked over said pad insulator layer;

removing a portion of said stacked layer for having an gate insulator space in said stacked layer to said pad insulator layer;

forming a gate insulator within said gate insulator space over said semiconductor substrate;

doping a lightly doped region with a first concentration of a first dopant type in said semiconductor substrate uncovered by said gate insulator and said isolation region;

removing said stacked layer and said pad insulator layer;

forming a semiconductor layer over said semiconductor substrate;

removing a portion of said semiconductor layer over said gate insulator to define a space over said gate insulator;

forming spacer structure in said space on a sidewall portion of said semiconductor layer;

removing a portion of said gate insulator for having a gate space over said semiconductor substrate;

doping an anti punchthrough region in said semiconductor substrate under said gate space with a second concentration of a second dopant type;

forming a first insulator layer on said semiconductor substrate under said gate space and on said semiconductor layer;

forming a gate filling to fill within said gate space;

removing a portion of said first insulator layer which is uncovered by said gate filling;

doping a plurality of junction ions with a third concentration of a third dopant type into said semiconductor layer;

forming a second insulator layer over said semiconductor substrate;

performing a thermal process to said semiconductor substrate; and performing a metalization process on said semiconductor substrate.

2. The method of claim 1, wherein said semiconductor substrate comprises a silicon substrate.

3. The method of claim 1, wherein said pad insulator layer comprises a silicon oxide layer which is thermally grown in an oxygen containing ambient on said semiconductor substrate with a thickness of about 50 angstroms to 400 angstroms.

4. The method of claim 1, wherein said stacked layer comprises a silicon nitride layer deposited with a thickness of about 300 angstroms to 2000 angstroms.

5. The method of claim 1, wherein said gate insulator comprises an oxide insulator grown from said semiconductor substrate in a thermal ambient containing oxygen, with a thickness of about 1000 angstroms to 4000 angstroms.

6. The method of claim 1, wherein said semiconductor layer comprises an undoped amorphous silicon layer forming by a chemical vapor deposition process with a thickness of about 300 angstroms to 3000 angstroms.

7. The method of claim 1, wherein said semiconductor layer comprises an undoped polysilicon layer forming by a chemical vapor deposition process with a thickness of about 300 angstroms to 3000 angstroms.

8. The method of claim 1, wherein said step of doping said lightly doped region is performed with a first ion implanting process at an energy between about 40 KeV to 300 KeV to have a dose between about 5E12 to 5E14 atoms/cm$^2$ for said lightly doped region, said first dopant type being selected from the group consisting of an arsenic containing dopant and a phosphorous containing dopant.

9. The method of claim 1, wherein said step of doping said anti punchthrough region is performed with a second ion implanting process at an energy between about 0.5 KeV to 30 KeV to have a dose between about 5E11 to 5E13 atoms/cm$^2$, said second dopant type being a boron containing dopant.

10. The method of claim 1, wherein said step of doping said junction region is performed with a first ion implanting process at an energy between about 5 KeV to 100 KeV to have a dose between about 5E14 to 5E16 atoms/cm$^2$, said third dopant type being selected from the group consisting of an arsenic containing dopant and a phosphorous containing dopant.

11. The method of claim 1, wherein said step of doping said lightly doped region is performed with a first ion implanting process at an energy between about 40 KeV to 300 KeV to have a dose between about 5E12 to 5E14 atoms/cm$^2$ for said lightly doped region, said first dopant type being a boron containing dopant.

12. The method of claim 1, wherein said step of doping said anti punchthrough region is performed with a second ion implanting process at an energy between about 0.5 KeV to 30 KeV to have a dose between about 5E11 to 5E13 atoms/cm$^2$, said second dopant type being selected from the group consisting of an arsenic containing dopant and a phosphorous containing dopant.

13. The method of claim 1, wherein said step of doping said junction region is performed with a first ion implanting process at an energy between about 5 KeV to 100 KeV to have a dose between about 5E14 to 5E16 atoms/cm$^2$, said third dopant type being a boron containing dopant.

14. The method of claim 1, wherein said spacer structure is formed by sequentially depositing and etching back of a nitride layer.

15. The method of claim 1, wherein said first insulator layer comprises an oxynitride layer with a thickness between about 20 angstroms to about 250 angstroms, said oxynitride layer being grown thermally from said semiconductor substrate and said semiconductor layer in a nitrogen and oxygen containing ambient.

16. The method of claim 1, wherein said gate filling is formed by sequentially depositing and etching back an undoped polysilicon layer.

17. The method of claim 1, wherein said second insulator layer comprises an oxide layer formed by a chemical vapor deposition.

18. The method of claim 1, wherein said thermal process comprises a rapid thermal process (RTP) performed with a temperature between about 700° C. to about 1100° C. for driving said plurality of junction ions into said semiconductor substrate to form a junction region, and for condensing said second insulator layer.

19. A method of forming a transistor in a semiconductor substrate, said semiconductor substrate having an isolation region, said method comprising the steps of:

forming a pad insulator layer over said semiconductor substrate;

forming a stacked layer stacked over said pad insulator layer;

removing a portion of said stacked layer for having an oxide insulator space in said stacked layer to said pad insulator layer;

forming an oxide insulator within said oxide insulator space over said semiconductor substrate;

doping a lightly doped region with a first concentration of a first dopant type in said semiconductor substrate uncovered by said oxide insulator and said isolation region;

removing said stacked layer and said pad insulator layer;

forming a silicon layer over said semiconductor substrate;

removing a portion of said silicon layer over said oxide insulator to define a space over said oxide insulator;

forming spacer structure in said space on a side wall portion of said silicon layer;

removing a portion of said oxide insulator for having a gate space over said semiconductor substrate;

doping an anti punchthrough region in said semiconductor substrate under said gate space with a second concentration of a second dopant type;

forming a first insulator layer on said semiconductor substrate under said gate space and on said silicon layer;

forming a gate filling to fill within said gate space;

removing a portion of said first insulator layer which is uncovered by said gate filling;

doping a plurality of junction ions with a third concentration of a third dopant type into said silicon layer;

forming a second insulator layer over said semiconductor substrate;

performing a thermal process to said semiconductor substrate; and performing a metalization process on said semiconductor substrate for forming a set of connections to said silicon layer.

20. The method of claim 19, wherein said semiconductor substrate comprises a silicon substrate.

21. The method of claim 19, wherein said pad insulator layer comprises a silicon oxide layer which is thermally grown in an oxygen containing ambient on said semiconductor substrate with a thickness of about 50 angstroms to 400 angstroms.

22. The method of claim 19, wherein said stacked layer comprises a silicon nitride layer deposited with a thickness of about 300 angstroms to 2000 angstroms.

23. The method of claim 19, wherein said oxide insulator is grown from said semiconductor substrate in a thermal ambient containing oxygen, with a thickness of about 1000 angstroms to 4000 angstroms.

24. The method of claim 19, wherein said silicon layer comprises an undoped amorphous silicon layer forming by a chemical vapor deposition process with a thickness of about 300 angstroms to 3000 angstroms.

25. The method of claim 19, wherein said silicon layer comprises an undoped polysilicon layer forming by a chemical vapor deposition process with a thickness of about 300 angstroms to 3000 angstroms.

26. The method of claim 19, wherein said step of doping said lightly doped region is performed with a first ion implanting process at an energy between about 40 KeV to 300 KeV to have a dose between about 5E12 to 5E14 atoms/cm$^2$ for said lightly doped region, said first dopant type being selected from the group consisting of an arsenic containing dopant and a phosphorous containing dopant.

27. The method of claim 19, wherein said step of doping said anti punchthrough region is performed with a second ion implanting process at an energy between about 0.5 KeV to 30 KeV to have a dose between about 5E11 to 5E13 atoms/cm$^2$, said second dopant type being a boron containing dopant.

28. The method of claim 19, wherein said step of doping said junction region is performed with a first ion implanting process at an energy between about 5 KeV to 100 KeV to have a dose between about 5E14 to 5E16 atoms/cm$^2$, said third dopant type being selected from the group consisting of an arsenic containing dopant and a phosphorous containing dopant.

29. The method of claim 19, wherein said step of doping said lightly doped region is performed with a first ion implanting process at an energy between about 40 KeV to 300 KeV to have a dose between about 5E12 to 5E14 atoms/cm$^2$ for said lightly doped region, said first dopant type being a boron containing dopant.

30. The method of claim 19, wherein said step of doping said anti punchthrough region is performed with a second ion implanting process at an energy between about 0.5 KeV to 30 KeV to have a dose between about 5E11 to 5E13 atoms/cm$^2$, said second dopant type being selected from the group consisting of an arsenic containing dopant and a phosphorous containing dopant.

31. The method of claim 19, wherein said step of doping said junction region is performed with a first ion implanting process at an energy between about 5 KeV to 100 KeV to have a dose between about 5E14 to 5E16 atoms/cm$^2$, said third dopant type being a boron containing dopant.

32. The method of claim 19, wherein said spacer structure is formed by sequentially depositing and etching back a nitride layer.

33. The method of claim 19, wherein said first insulator layer comprises an oxynitride layer with a thickness between about 20 angstroms to about 250 angstroms, said oxynitride layer being grown thermally from said semiconductor substrate and said semiconductor layer in a nitrogen and oxygen containing ambient.

34. The method of claim 19, wherein said gate filling is formed by sequentially depositing and etching back of an undoped polysilicon layer.

35. The method of claim 19, wherein said second insulator layer comprises an oxide layer formed by a chemical vapor deposition.

36. The method of claim 19, wherein said thermal process comprises a rapid thermal process (RTP) performed with a temperature between about 700° C. to about 1100° C. for driving said plurality of junction ions into said semiconductor substrate to form a junction region, and for condensing said second insulator layer.

* * * * *